(12) United States Patent
Cain et al.

(10) Patent No.: US 7,696,090 B2
(45) Date of Patent: *Apr. 13, 2010

(54) RECTIFYING DIODES WITH SELF-ALIGNED ELECTRODES

(75) Inventors: Paul A. Cain, Cambridge (GB);
Henning Sirringhaus, Cambridge (GB);
Anoop Menon, Cambridge (GB);
Catherine Ramsdale, Cambridge (GB);
Tim Von Werne, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 289 days.

This patent is subject to a terminal disclaimer.

(21) Appl. No.: 10/562,004

(22) PCT Filed: Jul. 2, 2004

(86) PCT No.: PCT/GB2004/002879

§ 371 (c)(1),
(2), (4) Date: Aug. 14, 2006

(87) PCT Pub. No.: WO2005/004194

PCT Pub. Date: Jan. 13, 2005

(65) Prior Publication Data

US 2007/0096080 A1    May 3, 2007

(51) Int. Cl.
*H01L 21/441* (2006.01)
(52) U.S. Cl. .............................. 438/677; 257/E51.027
(58) Field of Classification Search .................. 438/677; 257/E51.027
See application file for complete search history.

(56) References Cited

U.S. PATENT DOCUMENTS

| 6,270,389 | B1 * | 8/2001 | Kobayashi et al. | 445/24 |
| 6,317,174 | B1 * | 11/2001 | Noumi et al. | 349/42 |
| 7,407,849 | B2 * | 8/2008 | Sirringhaus et al. | 438/197 |
| 2003/0059987 | A1 | 3/2003 | Sirringhaus et al. | |
| 2003/0143339 | A1 * | 7/2003 | Kobayashi | 427/558 |
| 2005/0151820 | A1 * | 7/2005 | Sirringhaus et al. | 347/107 |

FOREIGN PATENT DOCUMENTS

| WO | WO 02/073712 A1 * | 9/2002 |
| WO | WO 02/095805 A2 | 11/2002 |
| WO | WO 03/056641 A | 7/2003 |

OTHER PUBLICATIONS

H. L. Gomes, et al, "Schottky Barrier Diodes From Semiconducting Polymers", IEE Proceedings: Circuits Devices and Systems, Institution of Electrical Engineers, Stenvenage, GB, vol. 144, No. 2, Apr. 9, 1997, pp. 117-122, XP006008326, ISSN: 1350-2409.

L. S. Roman, et al, "Polymer Diodes With High Rectification", Applied Physics Letters, American Institute of Physics. New York, US, vol. 75, No. 22, Nov. 29, 1999, pp. 3557-3559, XP012024179, ISSN: 0003-6951.

(Continued)

*Primary Examiner*—Sue Purvis
*Assistant Examiner*—W. Wendy Kuo
(74) *Attorney, Agent, or Firm*—Sughrue Mion, PLLC

(57) ABSTRACT

A rectifying diode comprising a semiconducting layer, a first electrode, and a second electrode, wherein the width of the region of closest contact between the two electrodes is on the order of the thickness of the semiconducting layer.

18 Claims, 11 Drawing Sheets

OTHER PUBLICATIONS

K. M. Strohm, et al, "Planar 100 GHz Silicon Detector Circuits", Microelectronic Engineering, Elsevier Publishers by., Amsterdam, NL, vol. 15, No. 1/4, Oct. 1, 1991, pp. 285-288, XP000292768, ISSN: 0167-9317.

Ben Rivera, et al, "Design and Layout of Schottky Diodes in a Standard CMOS Process", 2001 International Semiconductor Device Research Symposium. Symposium Proceedings (Cat. No. 01EX497) IEEE, Dec. 5, 2001, pp. 79-82, XP002296313, Piscataway, NJ, USA, ISSN: 0-7803-7432-0.

* cited by examiner (A) Forward Bias
Current flows

Reverse Bias
No current flows (B)

RECTIFYING DIODES WITH SELF-ALIGNED ELECTRODES

This invention relates to rectifying diode devices and their fabrication, and in particular to rectifying diodes preparable by solution processing and direct printing techniques, and methods for their fabrication.

A rectifying diode, i.e. a two-terminal device with asymmetric, nonlinear current-voltage characteristics, is an important element of many electronic circuits. Diodes can be used, for example, as nonlinear circuit elements that provide signal mixing capability. They allow generating an output signal at a frequency different from that of the input signal, for example, generation of signals at twice the input frequency, or generation of frequencies at the sum frequency $\omega_1 + \omega_2$ or the difference frequency $\omega_1 - \omega_2$ from two input signals at $\omega_1$ and $\omega_2$. This is important for radiofrequency (RF) communication and tagging applications, where communication between a contactless tag and a base station is established by emission of an RF signal with a given frequency, such as 125 kHz or 13.56 MHz, that is absorbed in an RF antenna coil on the tag. Higher sensitivities and immunity to noise can be achieved if the response of the tag is not at the same frequency, but at a frequency shifted from that of the signal emitted by the base station.

An important function for a rectifying diode in an RF identification (RFID) tag can be to provide the rectifying element that is used to rectify the AC voltage induced in the RF antenna and covert it into a DC voltage signal that is capable of providing the DC power to the logic circuit integrated on the tag. FIG. 1 shows a typical circuit with four rectifying diodes D1-D4 used to rectify the voltage induced by the RF radiation in an inductive coil.

In most applications a resonance circuit is formed between the inductor L and a capacitor $C_S$, such that the resonance frequency $\omega = 1/LC_S$ is close to the frequency of the RF radiation to be absorbed. Note that the load circuit connected to the antenna has of course a capacitance associated with it, which normally needs to be taken into account when choosing the value of the capacitor $C_S$. In some cases the load capacitance is sufficiently large that $C_S$ can be omitted altogether. However, the load capacitance should normally not be so large that is no longer possible to fulfill the resonance conditions without having to severely decrease the inductance L.

The conductor of the RF antenna has a series resistance $R_S$, which typically is less than 100-1000 Ω in order to achieve an antenna with sufficiently high quality factor. The diode circuit rectifies the AC voltage such that the voltage difference between points α and β of the bridge rectifier circuit is approximately constant, and can be used to provide the DC power supply for the operation of a logic circuit integrated onto the tag. The logic circuit might approximately be represented by a load resistance $R_L$ and a load capacitance $C_L$. This and other configurations for the diode rectification circuitry are known in the prior art.

There is currently growing interest in manufacturing of integrated electronic circuits by solution processing and additive printing techniques, that enable fabrication of electronic circuits on large areas and on flexible, plastic substrates at low-cost. This technology is based on (a) solution-processible semiconducting materials such as molecular or conjugated polymer semiconductors, (b) printable metals, such as conducting polymers, colloidal or precursor based inorganic metals and (c) solution-coatable dielectrics. Thin-film deposition and patterning of these materials can be achieved by techniques such as inkjet printing, screen printing, flexographic printing, offset printing, aerosol deposition, spray coating, blade coating, spin coating, or dip coating.

Rectifying diodes based on semiconducting conjugated polymers have been demonstrated (see for example, L. S. Roman, et al., APL 75, 3557 (1999)) in the prior art. They are formed by incorporating a thin film of polymer 3 into a sandwich structure between two conducting electrodes, anode 2 and cathode 4, respectively (FIG. 2B). Rectification is normally obtained if the work functions of the anode and cathode are different, resulting in a built-in electrical field in the semiconducting polymer. The metal work function and the ionisation potential and electron affinity, respectively of the polymer semiconductor determine the energy barriers for charge injection of holes and electrons at the metal-semiconductor contacts, respectively.

Diodes with high rectification are often fabricated by using materials that allow efficient charge injection from the metal electrode(s) into the semiconducting polymer under forward bias, but not under reverse bias. In the case of a unipolar device, where the current is carried by only one type of carriers, for example holes, this is achieved by adjusting the work function of the anode to be close to the ionisation potential of the (p-type) semiconductor, but fabricating the cathode from a material that has a significant barrier for hole injection to suppress current flow under reverse bias. In a bipolar device, where both electrons and holes contribute to the current, anode and cathode, respectively, are chosen such that they provide efficient injection of holes and electrons, respectively, under forward bias, but represent significant injection barriers for the other type of carrier under reverse bias (FIG. 2A).

Rectifying diodes based on semiconducting polymers have been fabricated with anodes based on high workfunction inorganic metals such as indium tin oxide or gold, and conducting polymers, such as PEDOT/PSS, and low workfunction cathodes, such as aluminum or calcium. The low-workfunction cathode material was deposited by vacuum deposition. It was found that the use of a conducting polymer layer, such as poly(ethylene dioxythiophene) doped with poly (styrene sulphonic acid) (PEDOT/PSS) as anode material improves the rectification ratio of the diodes significantly (L. S. Roman, et al., APL, 75, 3557 (1999)). In PCT/NO0/0012 a method for fabrication of an organic thin-film diode and transistors is described, which is based on thermal evaporation of metal electrodes, and spin coating of organic layers.

The methods for polymer-based rectifying diodes that are disclosed in the prior art do not allow fabrication of rectifying diodes by direct printing techniques nor do they allow operation of these diodes at radio frequencies for the following reasons.

1. Use of inorganic metals deposited by vacuum evaporation: The prior art is based on the use of inorganic metals for anode and, in particular, for cathode electrodes. The materials are deposited by vacuum deposition and are patterned by techniques such as photolithography or shadow mask evaporation. Although solution processible conducting polymers, such as PEDOT/PSS, have been used successfully for anode fabrication (L. S. Roman, et al., APL, 75, 3557 (1999)) while the low workfunction cathode was a vacuum sublimed inorganic metal.
2. Environmental stability: Rectifying diodes based on low-workfunction metal cathodes such as calcium need to be encapsulated carefully in order to prevent oxidation of the cathode by exposure to the atmosphere. The need for high-performance encapsulation is acceptable for some applications such as polymer light-emitting diode displays. However, for many low-cost applications of printed integrated circuits, the need to encapsulate the device would add intolerable manufacturing cost. For these applications it is not tolerable, that the cathode material of only a few diode elements in the circuit determines the encapsulation requirements while the other elements of the circuit, such as for example transistor elements, would require much less sophisticated encapsulation to achieve the desired reliability.

3. Process complexity: The rectifying diode will typically form part of an integrated circuit comprising other devices such as transistors. Polymer transistors are usually fabricated in multilayer structures with source and drain electrodes located on one level of the device, and the gate electrodes located on different level. However, it is possible to fabricate source-drain and gate electrode from the same, high-work function material, simplifying the manufacturing process. It would be highly desirable if rectifying diodes could also be fabricated with anode and cathode fabricated from essentially the same material.

4. Loss of rectification ratio at high frequencies: When a polymer diode fabricated according to the prior art and exhibiting a high DC rectification ratio is operated at high frequencies of 125 kHz or 13.56 MHz a decrease of the recitification ratio is observed. At 13.56 MHz most polymer diodes according to the prior art lose their rectification behaviour almost fully.

It is an aim of the present invention to provide a diode that can be produced by liquid processing (e.g. direct printing) and that can be used for rectification at radio frequencies.

According to one aspect of the present invention as recited in claim 1, there is provided a rectifying diode comprising a first electrode, a second electrode with a minimum separation of d between the first and second electrodes, and an organic semiconductor material in between the first and second electrodes with a ratio of SA over PA smaller than 10 where SA is the area of all points on the surface of the first electrode that lies within a distance of 3×d from any point on the second electrode and PA is the product of d and the length of the perimeter of SA.

We define the smallest separation d between the first and second electrode, which in most vertical diode configurations is equal to the thickness of the semiconducting film, and in the case of the in-plane diodes is equal to the separation L between the two electrodes. We define an area SA which is the area of all points on the surface of the first electrode which lie within a distance of 3 times d to any point on the second electrode, and a length P, which is the length of the perimeter of SA. SA is a measure of the overlap region between the two electrodes. We also define an area PA which is the product of P and d. PA is a measure of the area of all points that lie within a distance d to the edge of the smaller of the two electrodes. If SA and PA are comparable, i.e. the ratio between the two does not exceed a critical value of 10, the current in the device is confined mainly to an edge of the electrodes. If SA is much larger than PA, which is the case of two conventional electrodes according to the prior art with macroscopic overlap s (see FIG. 2), the current is flowing over the whole surface region of the electrodes. This is illustrated with the following example for a vertical diode configuration of the kind shown in FIG. 2. Assume two rectangular electrodes of identical shape that are displaced with respect to one another such that the length of overlap (in a direction substantially perpendicular to the planes of the semiconductor layer) between them is of dimension s. Assume W to be the width of the electrode in the direction perpendicular to the drawing plane in FIG. 2. In this case SA=W×(s+2.8×d), and PA=(2×W+2×(s+2.8×d))×d. If we assume W to be much larger than s, and s larger than d, then the ratio of SA/PA approximates to s/2d. In other words if s is much larger than d, as in the case of the diodes in the prior art, the region of overlap is macroscopic and the benefits claimed in the present invention are not obtained. In contrast, according to this aspect of the present invention the region of geometric overlap between the two electrodes would be comparable to the thickness of the active semiconducting layer.

With the techniques of the present invention, rectifying diodes based on molecular or polymer semiconductors can be fabricated by solution processing and direct printing techniques that provide good rectification not only at DC frequencies, but also radiofrequencies by reducing the geometric overlap capacitance of the diode while maintaining or enhancing its forward current density.

Preferred embodiments of the invention will now be described, by way of example only, with reference to the accompanying drawings, in which.

Figure 3:
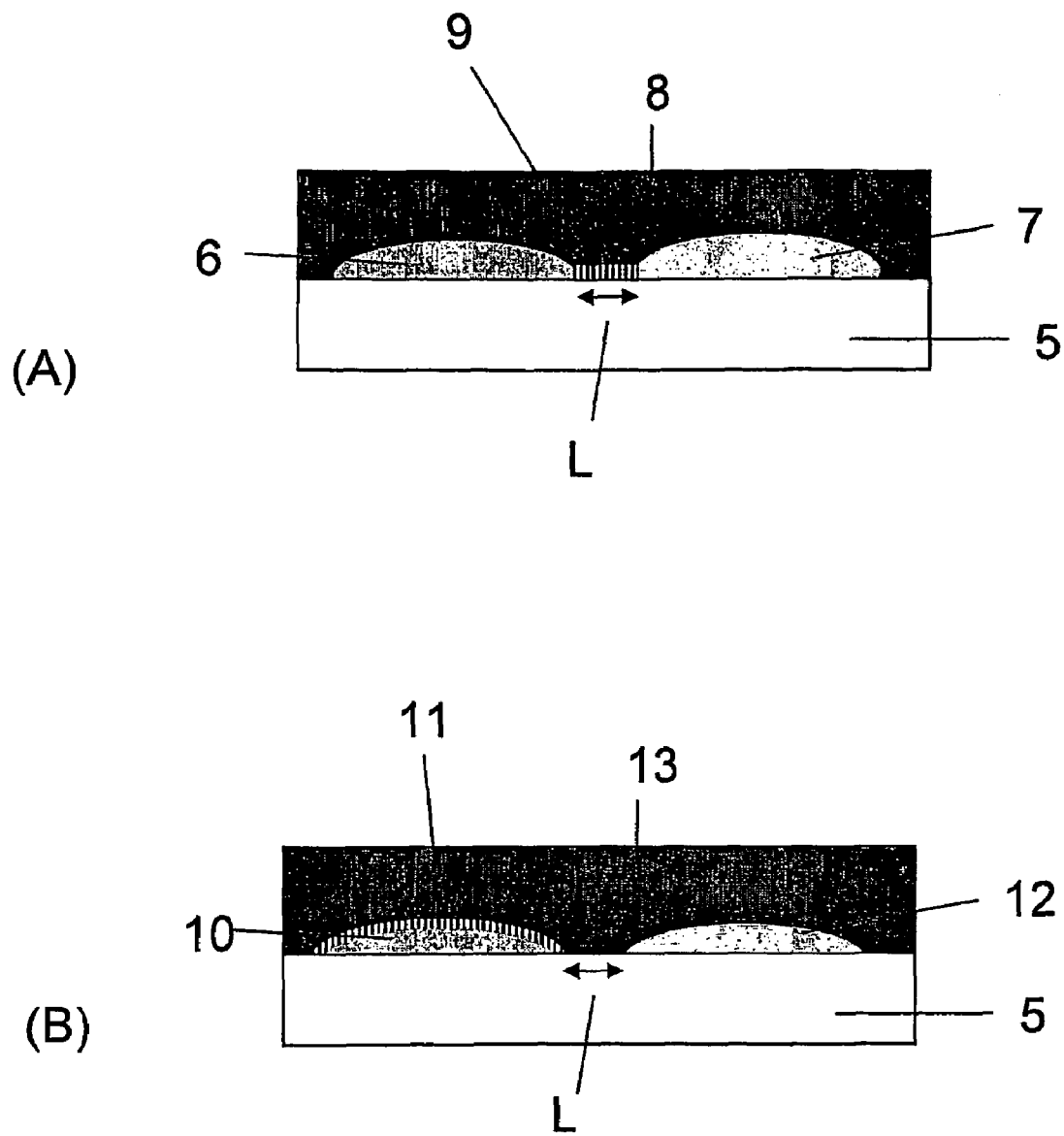
FIG. 3 shows in-plane rectifying diodes with a small capacitance with self-aligned, laterally offset anode and cathode electrodes according to embodiments of the present invention.

FIG. 3 illustrates a method that allows fabrication of a rectifying diode with a low capacitance and a high forward current density by direct printing with small capacitance, high forward current density, and high rectification ratio at frequencies exceeding 100 kHz. The method is based on reducing the geometric overlap capacitance between the anode and cathode of the diode by fabricating the diode in a planar configuration (FIG. 3) with anode (6) and cathode (7) defined on the same level of the substrate (5), and closely spaced from another. The semiconducting layer deposited (5) is deposited in contact with the two electrodes. In a planar rectifying diode the capacitance between anode and cathode is determined by the geometric overlap area between the two electrodes, and can be minimized simply by reducing the thickness of the two electrodes. Preferably, the electrodes have a thickness smaller than the thickness of the semiconducting layer. Preferably the two electrode materials are deposited from solution by an additive printing technique.

Anode and cathode can be fabricated from different conducting materials with different metal work function. The anode preferably has a higher workfunction than the cathode. The anode material is fabricated from a solution processible metal with a high workfunction, such as the conducting polymers PEDOT/PSS, polypyrrole, or polyaniline, or an inorganic metal, such as dispersion of inorganic metal nanoparticles or a chemical precursor solution of gold, palladium, nickel or platinum. A preferred choice for the anode material is the conducting polymer PEDOT/PSS. The cathode is fabricated from a solution-processible low work function metal such as a dispersion of inorganic metal nanoparticles or a chemical precursor solution of silver.

Alternatively, the anode and cathode material can be deposited from the same material, but one of the electrodes is subjected to a selective surface treatment modifying the surface electronic properties of one electrode with respect to the other electrode resulting in rectifying behaviour of the diode. Preferably, one of the two electrodes is deposited first and subjected to the surface treatment prior to the deposition of the second electrode. The surface treatment may consist of a chemical surface modification by deposition of a surface modifying agent, such as a self-assembled monolayer or a surfactant. Alternatively, the surface treatment may be a physical or physico-chemical treatment such as exposure to a plasma treatment, for example, a $CF_4$ or an oxygen plasma treatment. The ink used for the deposition of one of the two electrodes material might also contain an additive that modifies the electronic properties of one of the deposited metals, for example, increases or decreases its workfunction. An example of such an additive is a surfactant with a tendency to segregate to the surface and modify the electronic properties of the surface, i.e. to alter the injection characteristics of the electrode.

A high forward current density of the diode can be achieved by arranging that at least one of the two electrodes provides efficient Ohmic charge injection of majority carriers into the semiconductor. Many conjugated polymers, such as poly(3-hexylthiophene) (P3HT) or poly(dioctylfluorene-co-bithiophene) (F8T2) are slightly p-type doped, and the hole mobility is higher than the electron mobility. For such a polymer semiconductor, it is preferred to choose an anode material the workfunction of which is well matched to the ionisation potential of the semiconducting material, in order to achieve the maximum space-charge limited current density that is possible in a unipolar device under forward bias. Even higher current densities can be achieved by also forming an Ohmic or quasi-Ohmic contact at the electron injecting cathode, by choosing a cathode material with a work function close to the electron affinity of the semiconducting material. In this case the positive space charge of the injected holes can be partially compensated by injected electron space charge.

Preferably, the distance between anode and cathode is smaller than 1 µm, most preferably smaller than 100 nm in order to achieve a high forward current. For a planar diode this requires a high-resolution patterning step. Various techniques can be used to define the small gap between source and drain, such as UV photolithography, screen printing, gravure, offset and flexographic printing. According to one preferred embodiment of the invention (FIG. 3A) the gap is defined with the help of a surface energy pattern 9 formed on the substrate prior to deposition of the electrodes 6 and 7 (PCT/GB00/04934). The material for electrodes 6 and 7 is deposited from a liquid or solution that wets the bare substrate surface 5, but is repelled from the low surface energy region 9. When the liquid droplets hit the substrate surface, they spread, but the spreading motion is stopped when the contact line of the spreading droplet hits the surface energy barrier. In this way deposition of material 6 and 7 is confined to the respective side of the surface energy barrier, without risking electrical shorts across the gap.

Most preferably, the electrodes of the planar rectifying diode are fabricated by a self-aligned printing technique, as described in WO03/056641. In this technique, the surface of a first printed electrode 10 is modified in such a way as to provide a surface energy pattern 11 to repel the ink of a second printed electrode 12. The surface modification can either be performed automatically during the printing of the first electrode, for example by mixing the ink of the first electrode material with a surfactant molecule, or by post-deposition surface modification, for example by exposure of the first electrode to a $CF_4$ plasma treatment prior to deposition of the second electrode. The self-aligned printing technique is capable of defining very small gaps between the two deposited electrodes that can in principle be of molecular dimension. It allows fabrication of source and drain electrode of submicrometer channel transistors.

Figure 9:
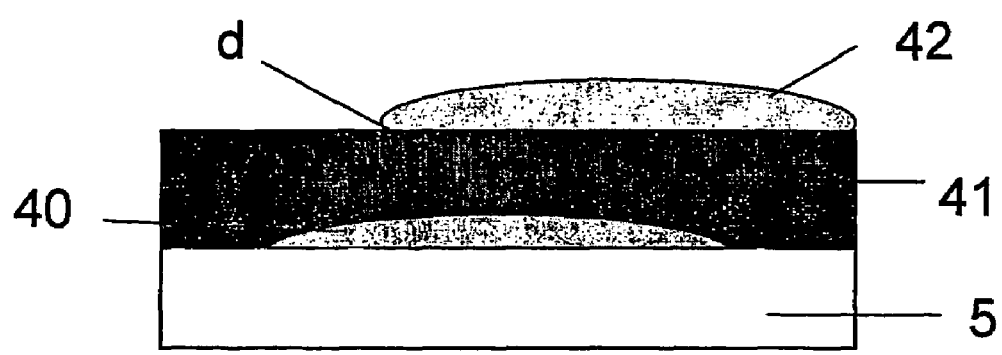
FIG. 9 shows a rectifying diode with a very thin semiconducting layer according to another embodiment of the present invention.
Figure 10:
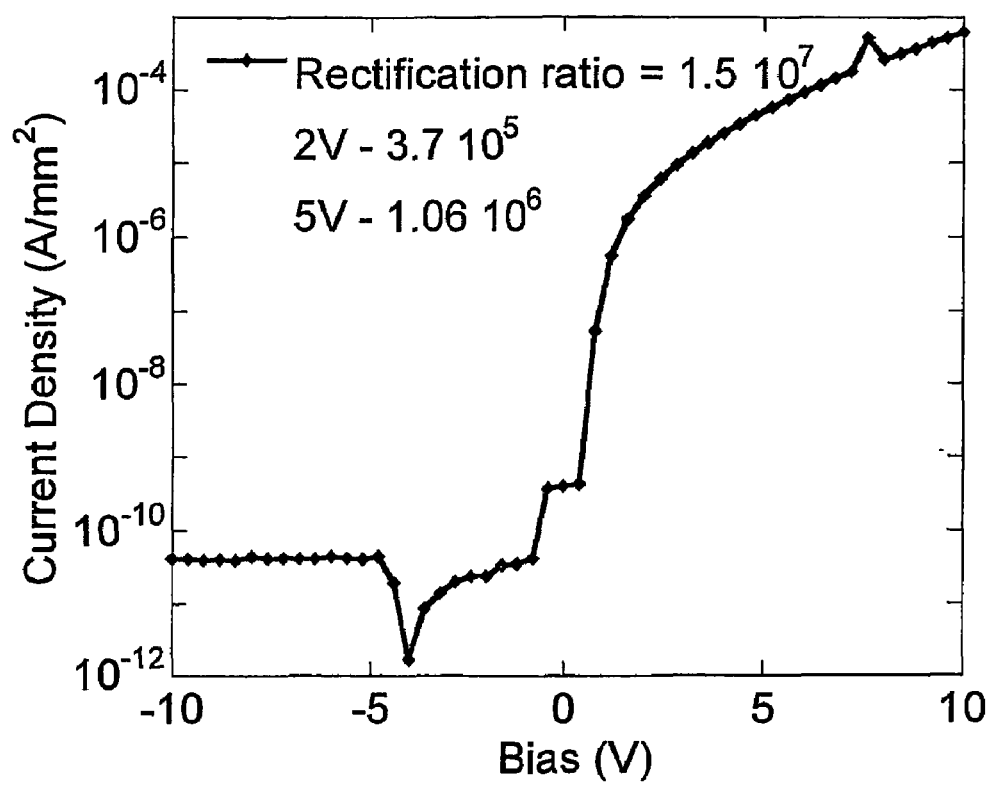
FIG. 10 shows current voltage-characteristics of a rectifying diode with PEDOT bottom electrode, silver top electrode, and a semiconducting layer of poly(dioctylfluorene-co-dihexyl-quinquethiophene) (F8T5) fabricated by a technique according to an embodiment of the present invention.

According to one embodiment, the anode and cathode are fabricated by the self-aligned printing technique from essentially the same material, and the rectifying behaviour of the diode is brought about by selective surface modification of one of the two electrodes. Preferably, the surface modification is performed on the first electrode prior to the deposition of the second electrode. The step of modifying the charge injecting properties of the electrode may be performed at the same time as the step of modifying the surface of the firstly deposited electrode to provide the repulsive properties for the deposition of the ink of the second electrode. In one embodiment, the surface modification step may provide both the surface repulsion and the desired charge injection properties. In one embodiment, the anode and cathode electrode are both formed from PEDOT/PSS. After inkjet deposition of the first PEDOT electrode onto a borosilicate glass substrate the surface is fluorinated by exposure to short $CF_4$ plasma treatment (250 W, 15 s). Afterwards the second electrode is inkjet deposited. The ink droplets are repelled from the first electrode, and deposited in the bare glass regions of the substrate immediately adjacent to the first electrode, defining a very short gap (see FIG. 9(A)). Atomic force microscopy topographs show that the gap between the two electrodes is very narrow (<100 nm), and cannot be detected by the AFM technique. Finally, the diode is completed by deposition of a semiconducting polymer film, such as P3HT or F8T2. PEDOT-F8T2-PEDOT devices fabricated in this way show clear rectifying behaviour. The current is lower when the first deposited (fluorinated) electrode is biased positive with respect to the second deposited electrode, i.e., the unmodified PEDOT electrode has better hole injection properties into F8T2.

The self-aligned printing technique allows fabrication of very small gap structures (<100 nm) with high forward current density and low probability for electrical shorts, since the contact region between the two electrodes is essentially a line, and not an area as in conventional diode configurations. The geometric overlap capacitance between the two electrodes is very small. It is advantageous if the electrodes have a tapered topographic profile where the thickness is becoming smaller towards the gap between the two electrodes (see FIG. 3B). In such a case the thickness of the region of smallest contact distance, which determines the overlap capacitance, is very small. The current density between source and drain remains high provided that the conductance of the electrode material remains sufficient up to the tapered edge, such that charge injection into the semiconductor occurs near the point of closest contact.

The first and second electrode can also be fabricated from different materials. The two materials and their workfunctions are chosen such as to give efficient injection of holes at the anode, and/or electrons at the cathode. The first electrode is either chosen such that its surface is repulsive for the ink of the second electrode, i.e. the contact angle of the ink of the second material on the surface of the first material is larger than that on the bare substrate surface (5). Alternatively, the first electrode may also be modified prior to deposition of the second electrode in an analogous way as described above. According to one embodiment, a first electrode of PEDOT/PSS is inkjet deposited onto a glass substrate and modified by exposure to a $CF_4$ plasma treatment (250 W, 15 s). Then a second electrode of silver is inkjet deposited from a nanoparticle dispersion in water, or a water ethylene glycol mixture. The silver ink is repelled by the fluorinated surface of PEDOT. The deposited silver pattern is then annealed at a temperature of typically 125-200° C. in order to increase the conductivity. The device is completed by deposition of a thin film of F8T2 or P3HT with a film thickness of 30 nm. The device exhibits rectifying characteristics, the current is higher when a positive bias is applied to the PEDOT electrode with respect to the silver electrode.

The process can also be performed by depositing the silver electrode first, and annealing it to a temperature of 125-200° C. Subsequently, the surface of the printed silver pattern can be modified by deposition of a self-assembled monolayer, such as an alkane-thiol or a fluoroalkane-thiol monolayer, in order to enhance the surface repulsion of the subsequently deposited PEDOT/PSS ink from the silver surface. Running the process in this sequence has the advantage that the silver electrode becomes insoluble in water during the annealing step reducing the risk for electrical shorts between the two electrodes. If the PEDOT is deposited first, case needs to be taken that the surface modification layer is sufficiently dense, that the subsequently deposited ink does not start to redissolve the first electrode while it is coming in contact with the first electrode during the printing process. It is also possible to perform the self-aligned printing process with two inorganic metal electrodes, such as silver or gold.

In all cases the first electrode can be surface modified with a self-assembled monolayer prior to deposition of the second electrode. Afterwards the second electrode can be modified separately with a second self-assembled monolayer. By then the first electrode is chemically passivated, and will not be modified by the second self-assembled monolayer. This allows fine-tuning separately the charge injection characteristics of the two electrodes.

Figure 2:
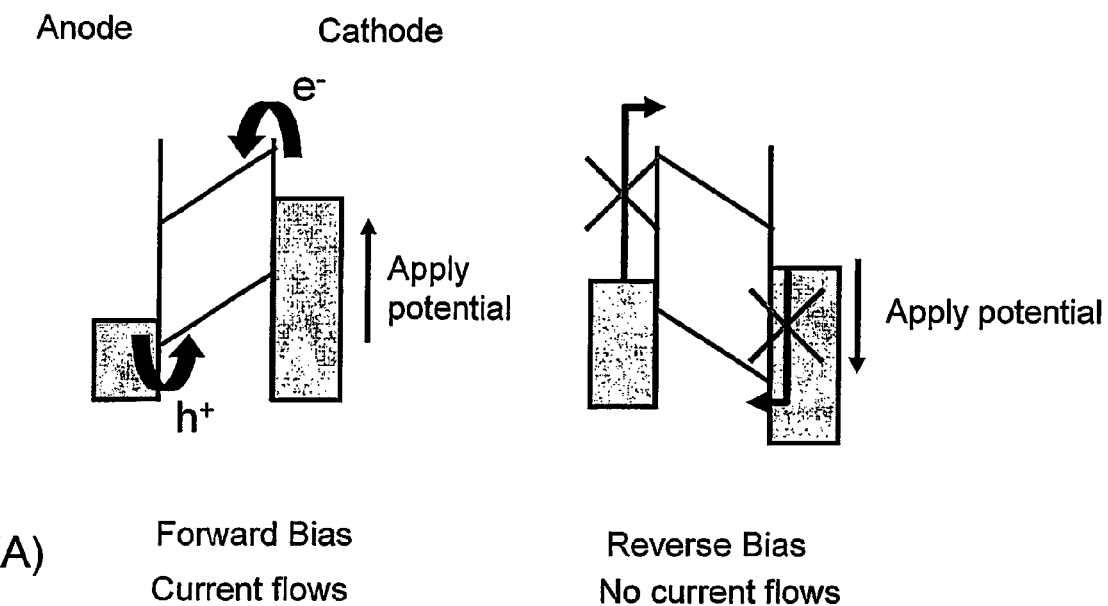
FIG. 2 shows a schematic energy diagram (A) and layer structure (B) for a polymer rectifying diode.
Figure 2:
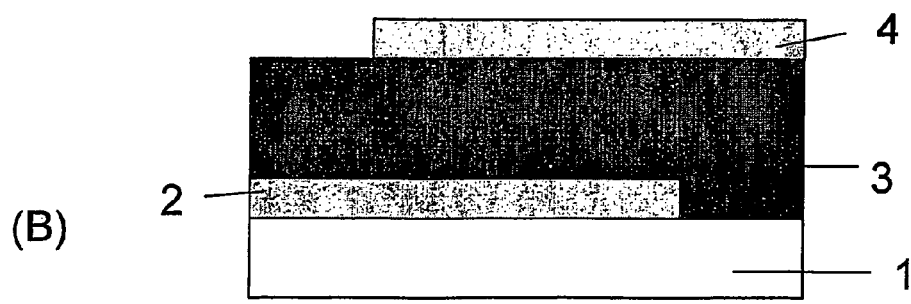
Figure 4:
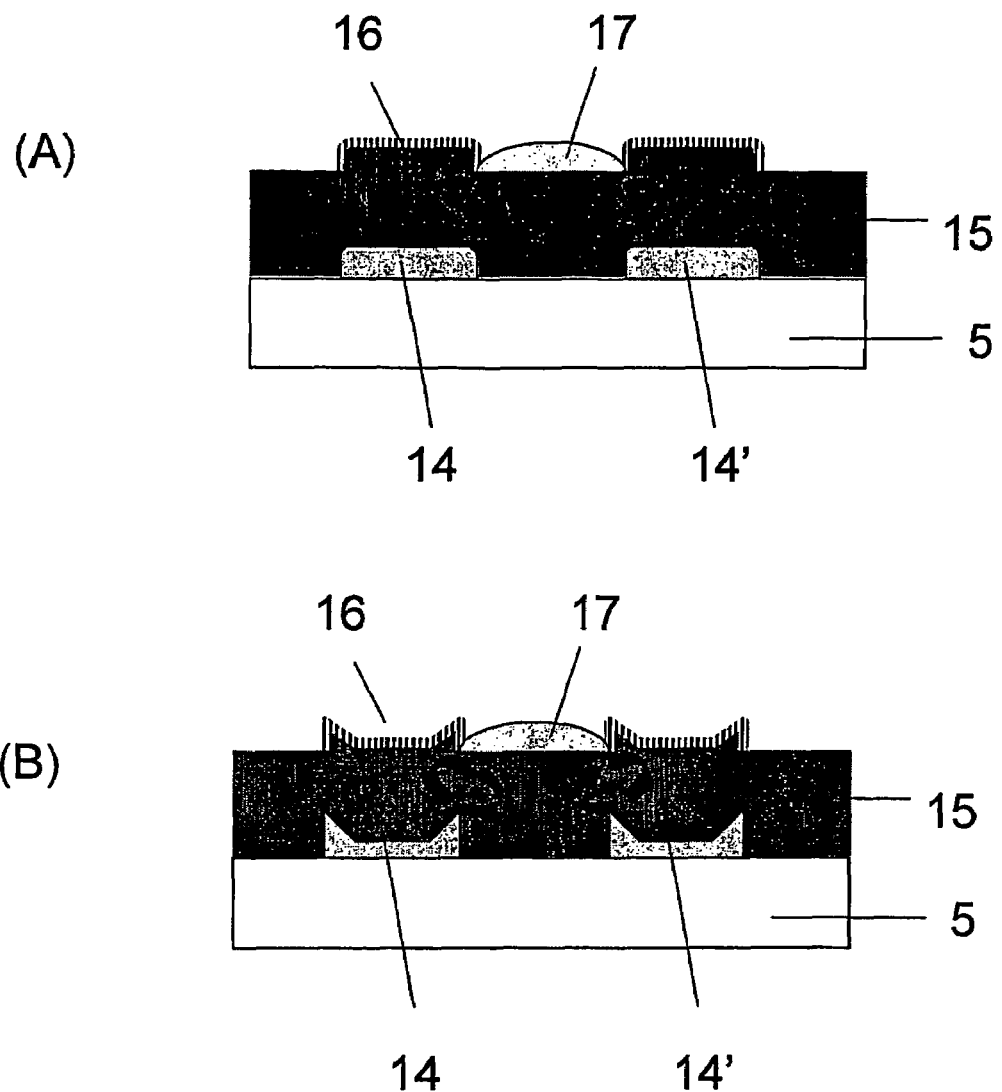
FIG. 4 shows rectifying diodes with laterally displaced top and bottom electrodes according to other embodiments of the present invention.

According to a second embodiment, a rectifying diode with a low capacitance and a high forward current density is formed with anode and cathode electrodes that do not directly overlap with each other (FIG. 4). Cathode and anode are printed in such a way that at least one edge of the anode is positioned within a distance on the order of the semiconductor film thickness to one edge of the cathode. Such a device configuration in which anode and cathode electrode patterns are shifted with respect to each other result in very small geometric overlap capacitance. The current flow is confined to the region near the edge. The ratio between forward current to capacitance is higher in such a device configuration compared to a conventional architecture (FIG. 2), as the current near the edge is higher both because of electric field enhancement near the linear edge, and because of spreading of the current flow lines near the edge.

The required total forward current can be achieved by adjusting the total length of anode and cathode lines, which might be formed in the shape of an interdigitated array to achieve a large length per unit device area.

It is preferred that anode and cathode are aligned with respect to each other to within a length that is on the order of the thickness of the semiconducting film. If the two electrodes overlap on a length scale much larger than the film thickness, the geometric overlap capacitance becomes significant, and the beneficial effect of edge operation is lost. On the other hand, if the region of semiconductor where anode and cathode do not overlap is much larger than the film thickness, the diode current is suppressed, as the effective distance between anode and cathode becomes much larger than the film thickness.

Accurate alignment between the two electrodes can be achieved by accurate registration of the cathode pattern with respect to the anode pattern. In the case of printed electrodes the registration accuracy can be enhanced with the help of a surface energy patterning of the substrate surface prior to printing.

Preferably the top electrode is self-aligned with respect to the bottom electrode. According to one embodiment, the self-alignment is achieved with the help of a topographic profile on the surface of the semiconducting film reflecting the position of the buried bottom electrode (FIG. 4). The bottom electrode 14 is formed as a thick film with a thickness higher than typically 100 nm. The thickness profile of the bottom electrode is chosen such that the thickness drops sharply towards the edge of the electrode. The deposition conditions for the semiconducting layer 15 are chosen such that the semiconducting layer coats the bottom electrode 14 conformally. In this way a topographic profile is generated on the surface of the semiconducting layer that can be used to self-align the edge of the top electrode 17 within a length scale on the order of the film thickness with respect to the bottom electrode 14. In one embodiment, the surface of the semiconducting layer is brought in contact with a flat stamp containing a surface modifying agent. The surface modifying agent 16 is transferred to the surface of the semiconducting layer only in the protruding regions where the substrate comes in contact with the stamp. The surface modifying agent is chosen such that it renders the surface of the semiconducting layer more lyophobic for the subsequently deposited ink of the top electrode. The flat stamp may be fabricated from a rubber such as poly(dimethylsiloxane) (PDMS) (PCT/GB01/04421).

The thickness profile of the first electrode 14 can be influenced by controlling the drying mode of the ink on the substrate. Under conditions where the contact line of the ink is pinned on the substrate 5 (for example, in the case of a low surface energy liquid on a wetting surface, or a microscopically rough surface), the printed bottom electrode pattern exhibits a drying ring, resulting in accumulation of the material near the edge of the electrode (FIG. 4B). The thickness of the electrode in the center can be controlled with the viscosity of the liquid, the drying time and the boiling point of the solvent in order to ensure sufficient conductivity in the center of the electrode. This drying mode is attractive because it provides a well-defined, sharp topographic profile on the surface of the semiconducting layer, which can be used for accurate self-alignment of the top electrode. This configuration has the additional attractive feature that the electrical field at the sharp edge of the bottom electrode is increased, which enhances injection of carriers from the bottom electrode into the semiconducting layer.

It is preferred that the bottom electrode is formed in multiple portions 14, 14' with a spacing close to the linewidth of the printed top electrode 17. This ensures that during the surface modification step of the semiconducting layer, the surface modifying agent is not accidentally deposited in the surface region of electrode 17. If for example the surface modifying agent is deposited using a flat stamp care needs to be taken not to bring the stamp in contact with the depressed surface region of electrode 17, i.e. sagging of the stamp needs to be avoided. This requires careful control of pressure. For the configuration shown in FIG. 4A the stamp is supported by closely spaced protruding regions and sagging of the stamp is less likely to lead to unintentional surface modification in the depressed surface region where electrode 17 is to be deposited.

Cathode and anode can be formed either from two different materials, such as but not limited to, colloidal or precursor silver, and PEDOT/PSS, or from essentially the same material. In the latter case rectifying behaviour might be obtained simply due to the different electronic properties of the semiconductor-on-metal interface with respect to the metal-on-semiconductor interface, or by subjecting the bottom electrode to a surface treatment prior to the deposition of the semiconducting layer, or by surface treatment of the semiconducting layer prior to deposition of the top electrode. Examples of such surface treatments are mixing a surfactant into the ink of the bottom electrode/semiconductor, or subjecting the surface to a physical-chemical treatment, such as exposure to an oxygen plasma treatment. According to a preferred embodiment of the invention the semiconducting layer is subject to an oxygen plasma treatment prior to deposition of the top electrode. The plasma treatment enhances the wetting properties of the semiconducting layer, and provides polar surface groups to enable selective surface modification for topographic self-alignment of the top electrode.

Figure 5:
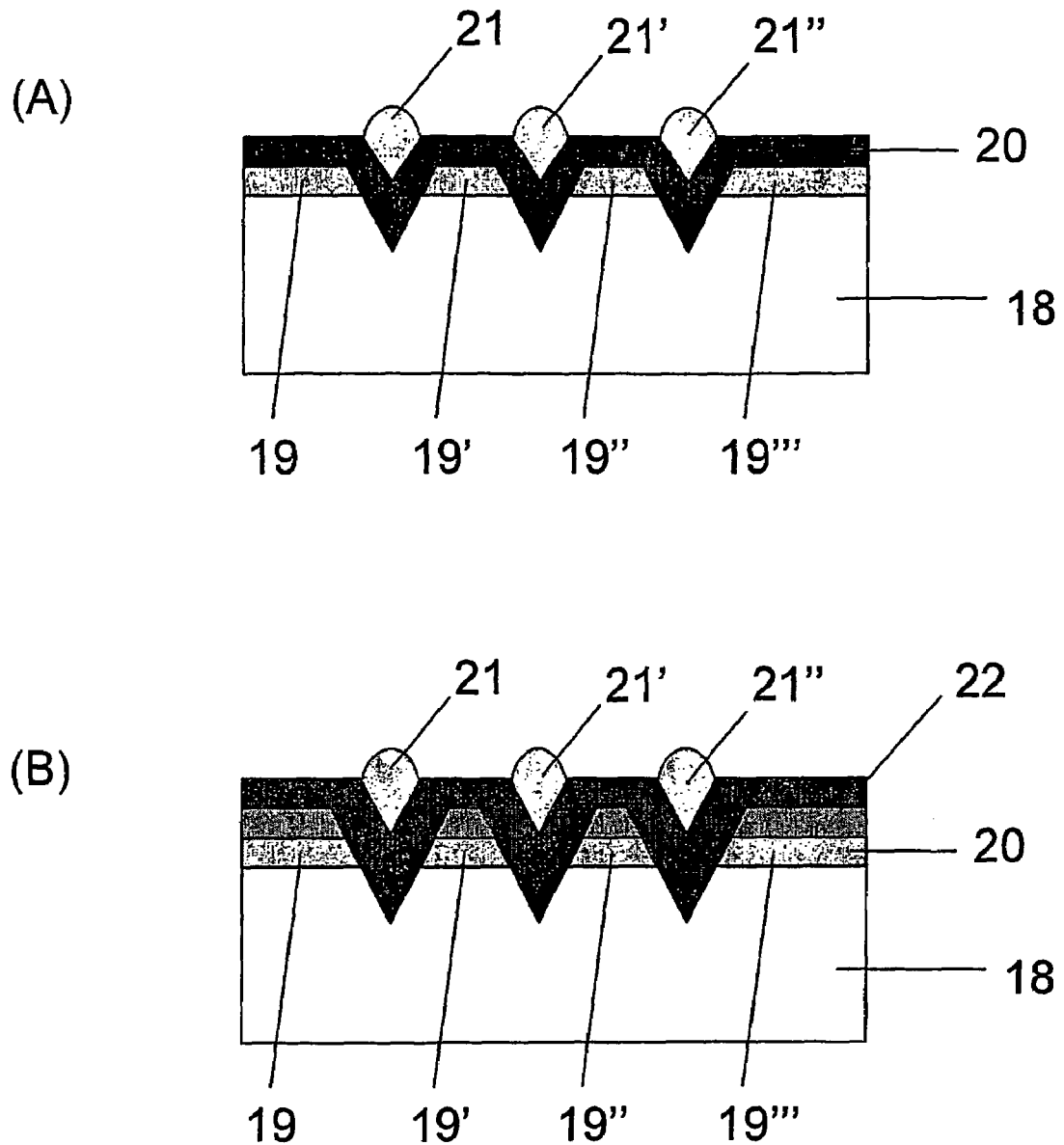
FIG. 5 shows rectifying diodes fabricated across a vertical side wall according to other embodiments of the present invention.

According to another embodiment, accurate self-alignment of the top electrode with respect to the bottom electrode is achieved by microstructuring the bottom electrode by embossing (FIG. 5A). In a first step a pad of the bottom electrode material is deposited onto a flexible plastic substrate 18. Then the bottom electrode is microcut into an array of parallel lines 19, 19', 19'', 19''', that remain connected at one end of the pad. The microcutting is performed by embossing with a hard master containing an array of sharp protruding wedges. The wedges may have different shapes. Preferably, the wedges have V-shape. The microcutting technique is described in detail in PCT/GB01/04421.

Subsequently, a thin film of semiconducting material is coated into the grooves in such a way that the grooves are not fully planarized. The topographic profile on the surface of the semiconducting layer generated in this way is then used to self-align the top electrode with respect to the bottom electrode. When the ink for the top electrode is printed onto the surface of the semiconducting layer the ink is attracted by capillary forces into the grooves, and does not deposit in the flat regions of the surface. The confinement of the top electrode to the grooves can be enhanced by selective surface modification of the semiconducting layer prior to deposition of the top electrode. In a first step the surface of the semiconducting polymer is made lyophilic (wetting) for the ink of the top electrode, for example by exposing the surface of the semiconducting polymer to an oxygen plasma treatment. The surface is then rendered lyophobic selectively in the flat regions of the substrate, for example by bringing the substrate in contact with a flat stamp inked with a surface modifying agent. An example is a stamp of polydimethylsiloxane (PDMS) inked with a self-assembling molecule, such as octyl-trichlorosilane (OTS). Alternatively, a surface modifying layer can be evaporated under shallow angle of incidence, such that no deposition occurs inside the shadowed grooves. The surface energy pattern generated in this way enhances the forces that confine deposition of the top electrode inside the embossed grooves. A rectifying diode fabricated in this way with the top/bottom electrode used as anode cathode or vice versa has a low capacitance, but high forward current density. Charge injection into the semiconducting layer is enhanced by the presence of sharp edges of the electrode patterns, i.e. the thin injecting edge of the bottom contact, and the sharp protruding edge of the top electrode inside the groove.

Further reduction in capacitance can be achieved by incorporating a thick dielectric layer 22 into the structure (FIG. 5B). This restricts the area of injection from the bottom electrode to a line-type injector exposed in the side wall of the groove. The position of the injector with respect to the edge of the top electrode can be adjusted with the embossing depth (affected by wedge shape, embossing time, pressure and temperature), and the thickness of dielectric layer 22.

Figure 6:
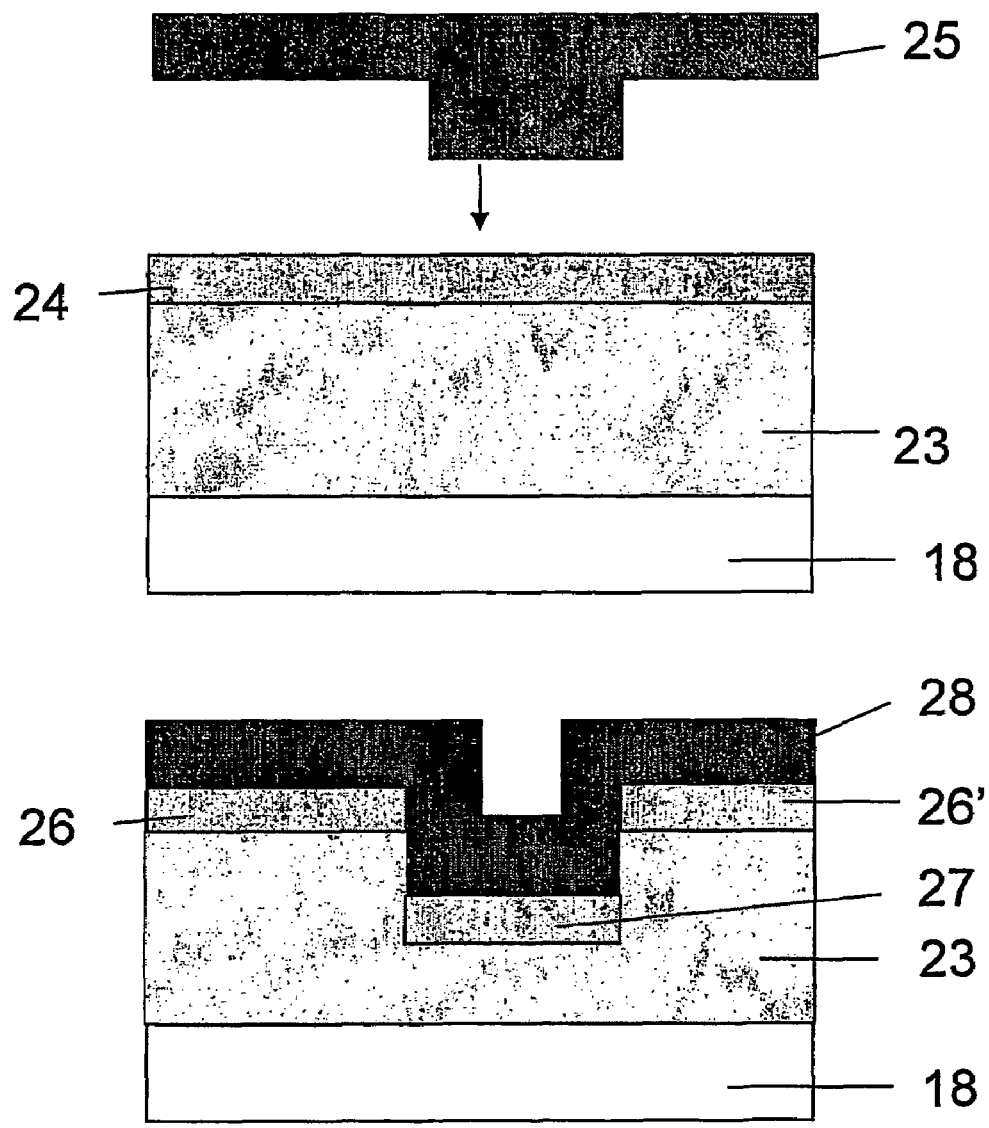
FIG. 6 show a different configuration for a rectifying diode fabricated across a vertical side wall according to another embodiment of the present invention.

According to another embodiment, a metallic layer 24 on top of a flexible plastic substrate 18 (that might also contain one or more polymer overlayers 23) is embossed with a master 25 that has a step-like topographic profile. During the embossing step the portion of the metallic layer underneath the protrusions on the master is pressed into the plastic substrate microcutting the metal layer (FIG. 6). Two separate electrodes 26,26' and 27 are defined. Subsequently, a semiconducting layer 28 is deposited. Although electrodes 26 and 26' are necessarily formed from the same material in this process, the diode formed with using electrode 26, 26' as anode, and electrode 27 as cathode, or vice versa exhibits rectifying behaviour. This is believed to be due to the different injection geometries at the top and bottom electrodes, and the topographic profile of the semiconducting layer coated into the groove.

In an alternative device configuration the semiconducting layer is part of the embossed substrate, i.e. layer 23 in FIG. 6 could be the semiconducting layer with a metallic layer deposited on top, that is then subsequently embossed in the way described above.

The effective thickness of the rectifying diode is determined by the depth to which the portion 27 of the metal layer is pressed into the substrate. This depends on the height of the step profile on the master, and the embossing conditions (time, pressure, temperature).

Figure 7:
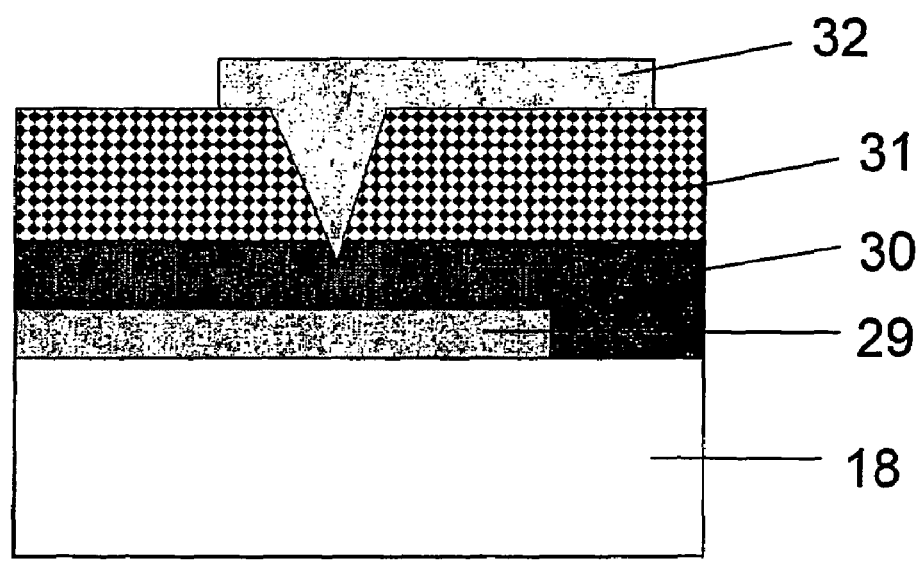
FIG. 7 shows a rectifying diode with one of the two electrodes fabricated as a point contact according to another embodiment of the present invention.

According to another embodiment, a polymer rectifying diode with a high forward current density and low capacitance is formed by forming one of the electrodes as a point contact. FIG. 7 shows a schematic diagram of such an embodiment. First a bottom electrode 29 is formed on the substrate as a thin film. Then a thin semiconducting film 30 with a thickness of less than 1 μm, preferably less than 100 nm is deposited on top, followed by the deposition of a thick dielectric layer 31. The thickness of the dielectric layer is larger than 100 nm, preferrably larger than 1 μm. Then this multilayer structure is embossed with a master containing an array of sharp protruding cones or pyramids. Such masters can be fabricated for example by anisotropic etching of silicon, followed by replica production (see, for example, PCT/GB01/04421). By adjusting the height of the protrusions on the master, the embossing time, temperature and pressure the embossing depth is adjusted to be slightly larger than the thickness of the dielectric layer, but smaller than the thickness of the dielectric layer+the thickness of the semiconducting layer. In this way an inverted cone- or pyramid-shaped via-hole interconnection is embossed into the dielectric layer, which is then subsequently filled with conducting material 32 to provide a top point contact to the semiconducting layer. In this architecture the capacitance between the top electrode and the bottom electrode can be reduced by increasing the thickness of the dielectric spacer layer 31.

Alternative device configurations are possible. The dielectric layer 31 may be omitted, and instead a thick semiconducting layer can be embossed directly, followed by filling of the embossed holes with conducting material. The current flow in such a device is still localized around the sharp tips, both because of the field enhancement in the vicinity of the apex of the tip, and the fact that underneath the tips the thickness of the semiconducting layer is smallest.

Figure 8:
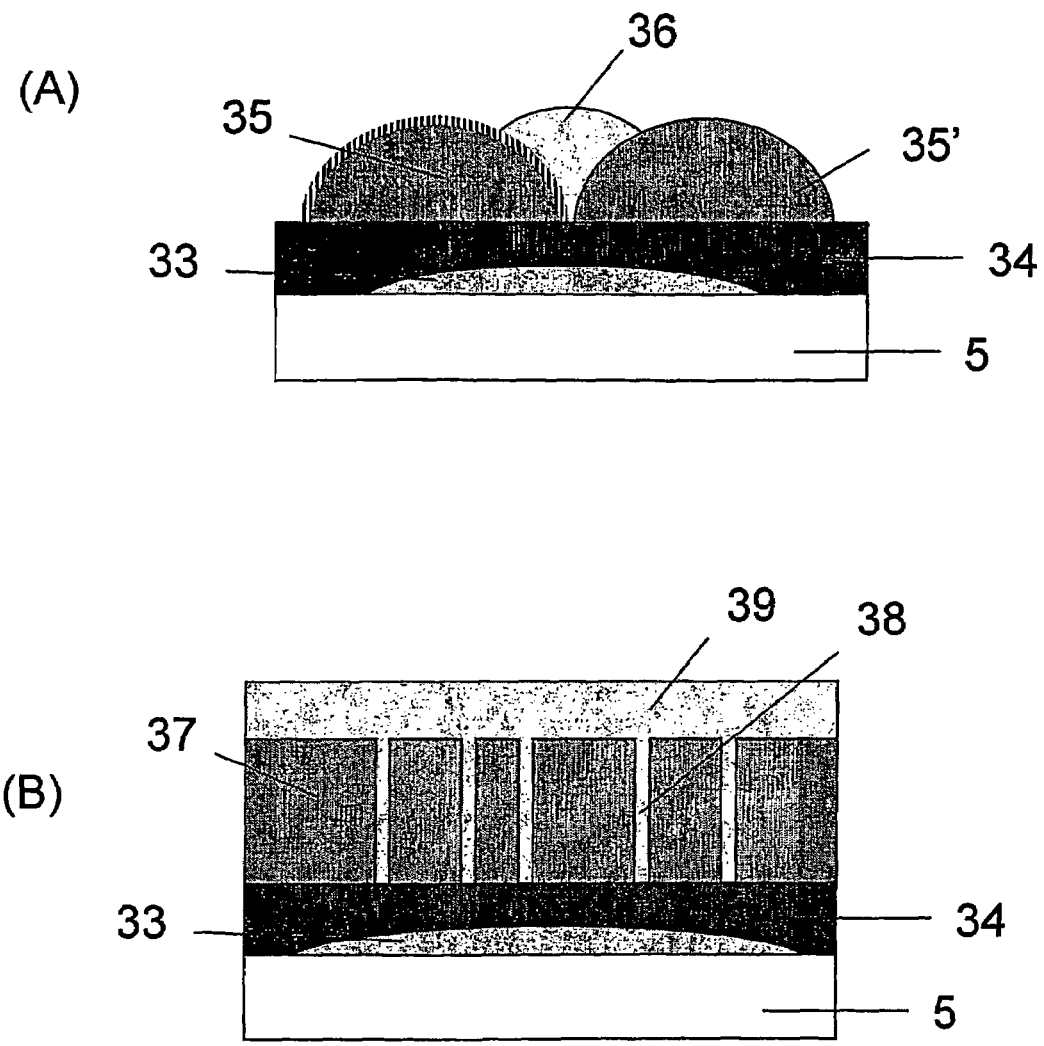
FIG. 8 show differents configuration for a rectifying diode with one of the two electrodes fabricated as point contact or line contact according to other embodiments of the present invention.

An alternative embodiment is based on fabrication of small diameter viaholes in a thick dielectric layer deposited in contact with the semiconducting layer (FIG. 8). One of the two electrodes makes contact with the semiconducting film only in the area of the small viaholes. Preferrably the diameter of the viaholes is on the order of the thickness of the semiconducting layer, and the thickness of the dielectric layer is larger than that of the semiconducting layer.

The small viaholes provide an array of localized injection sites into the semiconducting layer.

Several methods can be used to fabricate such small viahole structures. According to one embodiment (FIG. 8A) the viaholes are fabricated by the self-aligned printing technique. After deposition of the semiconducting layer 34 on top of the bottom electrode 33 a first dielectric pattern 35 is deposited onto the surface, and its surface it modified by one of the techniques described above to be lyophobic for the ink of the second dielectric pattern 35'. A small gap is formed between the dielectric patterns 35 and 35'. Subsequently, the small gap is filled with conducting material for the top electrode, such that the top electrode forms a line or a point contact only with the semiconducting material.

The drying mode of the dielectric layers 35, 35' is controlled such that their topographic profile exhibits a steep rise of thickness away from the edge. This ensures a high electric field at the line/point contact of the top electrode with the semiconducting layer, and also reduces the geometric overlap capacitance between the top and bottom electrode by increasing the distance between the top and bottom electrode in all regions other than the viahole reigion. For a unipolar diode is preferred that the carriers are injected from the top electrode under forward bias. The two electrodes may either be composed of different materials, or of essentially the same material. In the latter case the rectification behaviour is induced by the different injection geometries from the two electrodes into the semiconductor.

It is preferred that the semiconducting layer has a thickness less than 100 nm, preferably less than 50 nm, most preferably less than 30 nm. The forward current of the diode increases more rapidly with decreasing thickness than the capacitance enabling higher speed operation as discussed in more detail below.

Similar device configurations are possible by microstructuring the bottom electrode in an analogous manner. Instead of point contacts lines contacts might also be used.

An attractive feature of the point (or line) contact configuration is that rectification is simply obtained by the asymmetry of the electric field at the flat bottom and sharp top electrode without the need for fabricating the two electrodes from different materials.

Alternatively, the localized injector might also be fabricated by inducing pinhole formation 38 in a dielectric 37 that is deposited as a thin film on top of the semiconducting layer 34 (FIG. 8B) or prior to the semiconducting layer on top of the electrode on the substrate. Pinhole formation can be induced by causing stress in the film, for example by simply annealing the film at elevated temperature. A preferred method is to bring the film in contact with a stamp that contains an array of sharp protruding wedges or tips while the film is being kept at a temperature above or near its glass transition temperature (Kim et al., Advanced Materials 15, 332 (2003)). In the latter case the force between the tips and the film causes the film to breakup locally underneath each tip. The size of the generated via-holes can be controlled by the annealing time and temperature. The via-hole diameter is the smaller the shorter the annealing time. In this way via-holes with diameters less than 100 nm can be generated. The via-holes may be arranged in a regular array within the active area of the diode or they may be arranged quasi-randomly, as in the case of thermally induced pinhole formation.

According to another embodiment, a rectifying diode with a high forward current is formed from a planar diode with a very thin film of semiconducting material with a thickness of less than 50 nm, preferably less than 30 nm, most preferably less than 20 nm.

Such very thin polymer diodes have not been used as high frequency rectifying diodes yet, because a reduced DC rectification ratio is observed in ultrathin diodes compared to conventional polymer diode with semiconductor thickness exceeding 50-100 nm. The latter exhibit much higher DC rectification ratio exceeding $10_5$. In very thin diode the DC rectification ratio is much reduced.

However, surprisingly, we have discovered that the rectification behaviour of ultrathin polymer diodes in spite of their poor DC rectification ratio is improved at higher frequencies, and they exhibit good rectifying behaviour at frequencies of 125 kHz and 13.56 MHz compared to a conventional polymer diode with thickness exceeding 50-100 nm.

In a first step a bottom electrode 40 is formed on a substrate 5, for example by inkjet deposition of PEDOT/PSS, then a very thin film of semiconducting material 41, such as F8T2 or P3HT, with a thickness of less than 50 nm, preferably less than 30 nm, most preferably less than 20 nm is deposited. Finally, a top electrode 42 is deposited, for example by inkjet deposition of colloidal or precursor silver.

Without wanting to be bound by theory, the improved rectification ratio of an ultrathin polymer diode compared to a conventional polymer diode might be explained in the following way. Using the equivalent circuit for the diode discussed above, the maximum operating frequency of a rectifying polymer diode is determined by the inverse of the product of the diode capacitance and its forward resistance. The geometric capacitance of the diode increases approximately linearly with the inverse thickness of the semiconducting layer. However, in the space charge limited regime the forward current density increases with the inverse thickness d to a power of n, where n is larger than 1. For ideal space-charge limited current behaviour following Child's law n is equal to 3, $I_F \propto d^{-3}$. The forward current of an ultrathin diode increases much faster with decreasing thickness than its capacitance. Therefore, the thinner the diode the smaller the RC time constant of the equivalent circuit of the diode, and the higher the frequency at which adequate rectification can be obtained.

The simplest equivalent circuit diagram to represent a rectifying diode consists of a parallel combination of a capacitor $C_d$ (representing, in the simplest case the geometric capacitance of an undoped semiconducting polymer layer sandwiched between anode and cathode), and a nonlinear resistor.

Let $R_{Rev}(V_{rev})$ and $R_{Forw}(V_{Forw})$ be the resistance of the diode under reverse and forward bias, respectively. When an alternating voltage is applied to the diode, the current will flow through the capacitance, i.e. will not experience rectification, if the resistance of the diode is larger than the impedance of the capacitor. Typical polymer diodes fabricated in the prior art have a thickness on the order of 100 nm, and a dielectric constant on the order of 3.5, corresponding to a capacitance on the order of 30 nF/cm². This implies an impedance $Z_c=1/\omega C=0.4\ \Omega/cm^2$ (13.56 MHz) and 42 $\Omega/cm^2$(125 kHz). On the other hand the typical forward current density of a polymer diode is on the order of 0.1A/cm² at a voltage of 10V. This implies that the forward bias impedance of the diode is on the order of 100 $\Omega/cm^2$. This is larger than that of the capacitance, meaning that even under forward bias the AC current will flow through the capacitor, and not the rectifying diode. Under reverse bias the diode resistance is even higher and the current will also flow through the capacitor. Therefore, a polymer diode of the prior art exhibits no rectification at high frequencies of 13.56 MHz (125 kHz). The key to achieving rectification at high frequencies is to ensure that the forward bias resistance $R_F$ is sufficiently small, that under forward bias the AC current is not also flowing through the capacitor, i.e. $1/R_F \cdot C > \nu_{RF}$. It is not necessary that the DC rectification ratio of the diode is higher than typically 100.

The forward current density of the rectifying diode needs to be sufficiently high to allow supplying the total current $I_s$ that is drawn from the power supply by the logic circuit of the tag. $I_s$ is typically on the order of 100 μA-1 mA for a p-type logic circuit containing 1000-10000 gates constituting a typical load resistance on the order of 10 kΩ-1kΩ. The required current supplied by the diode can be achieved by adjusting the area/width of the rectifying diode.

The forward current density of the rectifying diodes also needs to be able to charge the load capacitance $C_L$ of the logic circuit within a sufficiently fast time scale. It is not necessary that the load capacitance is charged fully within a single period of the RF wave, but the DC bias can be built up over several periods. However, the smaller the forward current density, the longer it will take before the DC bias generated by the diodes is available as power supply to the tag.

For all of the above methods the semiconducting layer is fabricated preferably from a material with high charge carrier mobility, for at least one of the electron and hole carriers, most preferably for both carriers. In a unipolar device where the current is carried mainly by one type of carrier the space charge limited current flowing in the device is the larger the higher the mobility of the semiconductor. In a bipolar device, where both electrons and holes can be injected from the respective electrodes under forward bias, the forward current can be even higher than the space charge limited current of the respective unipolar device due to partial compensation of the space charge of one carrier by the space charge of the other carrier.

A high charge carrier mobility is also required to ensure that the diode current responds to the applied AC bias. The mobility p of charge carriers carrying the current in the diode of thickness d, to which a voltage V is applied needs to be sufficiently high to allow modulation of the current with the required frequency f, $$\text{i.e. } \frac{\mu \cdot V \cdot \pi^2}{d^2} > \upsilon_{RF}.$$

The semiconducting material may also be a blend of two or more components, for example, a blend of a hole transporting polymer such as P3HT, polyfluorene derivatives such as F8T2, or polyphenylene vinylene derivatives and an electron transporting polymer, such as poly(dioctylfluorene-co-benzothiadiazole) (F8BT). In this case the electron and hole transporting properties can be optimized separately for the two polymers. The phase separation of the two polymers needs to be controlled to form a bicontinuous network.

Examples of suitable additive printing techniques for the deposition of the electrodes and semiconducting layer are, but not limited to, inkjet printing, screen printing, stencil printing, offset, gravure and flexographic printing. The anode material is fabricated from a solution processible metal with a high workfunction, such as the conducting polymers PEDOT/PSS, polythiophene, polypyrrole, or polyaniline, or an inorganic metal, such as dispersion of inorganic metal nanoparticles or a chemical precursor solution of gold, palladium, nickel or platinum. A preferred choice for the anode material is the conducting polymer PEDOT/PSS. The cathode is fabricated from a solution processible low work function metal such as dispersion of inorganic metal nanoparticles or a chemical precursor solution. A suitable metal with reasonably low workfunction, and adequate stability is silver.

Further rectification can be obtained upon optimisation of the work function of electrodes in order to control injection of carriers. The work function of a material can be obtained using electrical or chemical surface energy modification. The modification could be performed either before or after deposition of the semi-conducting layer or layers i.e. either of the electrodes, or indeed the substrate or semi-conducting layer(s), could be modified to induce electronic or chemical differences between the injection properties of electrodes.

The workfunction of the bottom electrode can be modified by the use of self-assembled monolayers (SAMs). A SAM is a single layer of molecules on a substrate. The molecules exhibit a high degree of orientation, order and packing. Examples of SAMs which could be used to modify the electrode include, but are not limited to, alkanethiols, isonitriles and acetylides. The terminating group of such species determines the workfunction of the modified electrode, which may be more or less electronegative than the original electrode material. SAMs are usually deposited by dip-coating or vapour exposure, after which the sample is rinsed before deposition of the other device layers. These techniques are compatible with inkjet printing and easy to incorporate into a roll-to-roll process. Modification of the bottom electrode may also be achieved by using a plasma treatment, for example oxygen plasma. Plasma treatment could also be used after the deposition of the semi-conducting layer to induce modification at the semi-conductor/top electrode interface.

The use of different solvents or different solvent ratios for ink formation may also induce sufficient differences between electrodes of the same material such that diode behaviour is achieved. For example, altering the proportion of glycerol to water in a PEDOT:PSS suspension induces rectifying behaviour in a diode with both PEDOT/PSS anode and cathode electrodes.

Alternatively similar electrodes can be used and rectification can be achieved by using two semi-conducting layers, depending on the relative positions of their energy levels. For example, in hole-transporting devices the difference between the energies of the highest molecular orbital state (HOMO) of the semiconducting layers and the electrode/semiconductor HOMO level differences define how the diode will operate. A blocking layer for minority carriers can also be incorporated to increase the rectification ratio further. Vertical segregation between the two semi-conducting layers, which is required for effective rectification, can be achieved either by manipulation of the drying dynamics to induce spontaneous phase separation, or by modifying the choice of material or solvent or deposition conditions such that there is limited intermixing between the materials.

Alternatively, the rectification behaviour of the diode can be induced by using a polymer semiconductor in the form of an additively deposited polymer multi-layer or a vertically phase-separated conjugated polymer blend.

Typical polymer diodes rely on the difference in work function of the electrodes to achieve rectifying properties. It has been recently shown that conjugated polymer blends, with significantly different electron affinities and ionisation potentials, can be made to vertically-segregate such that a phase of predominately one polymer would be at one electrode and a phase of predominately a second polymer would be adjacent to the other electrode. (A. C. Arias, et al., APL, 80, 1695 (2002))

If the materials are chosen appropriately, charge of one sign passing across this structure it would have to surmount a greater energy barrier in one direction than in the other due to the gradient in electron affinity or ionisation potential in the vertically segregated structure. This could be achieved in materials combinations such as CN-PPV/MEH PPV, F8BT/PFB, or soluble hexabenzocoronene/perylene blends or multi-layers. In this way, rectification can be achieved in a polymer blend structure even with the same electrode material for anode and cathode such as a solution-processed polymer electrode (ie PEDOT:PSS) or the rectifying behaviour of a non-common electrode diode could be enhanced by the presence of a vertical segregation or multi-layer.

The vertically-segregated blend may be created by choosing an appropriate pair of polymers and a solvent with a suitable viscosity and boiling point and with the appropriate solubility characteristics such as PFB:F8BT in isodurene. The surface on which the blend is deposited may also be modified by plasma treatment, self-assembled mono-layer or other means to produce or enhance the segregation effect. It is also possible to inkjet print this blend, and the slow drying that occurs during IJP allows for the required self-organisation processes.

Alternatively, the vertical segregation can be created by IJP deposition of successive layers of conjugated polymer with different electron affinities and/or ionisation potentials, that are either dissolved in non-common, orthogonal solvents or deposited in such a way that the dissolution time of the underlying already dried layer is long enough such that significant dissolution of this layer during exposure to subsequently applied solutions is limited.

Alternatively, the first deposited layer is annealed or otherwise treated to limit its dissolution in the solution of subsequently deposited layers.

Alternatively, a self-assembled molecular barrier layer is applied to the top surface of the underlying layer to mask it from the solution of the next layer and therefore prevent dissolution of the underlying layer. It may be required to plasma treat the underlying layer to enable the self-assembly process.

Alternatively, a cross-linking agent is added to the bottom layer, or a precursor polymer is used for the bottom layer in order to prevent the dissolution during deposition of the next layer.

In an RFID application, diodes are also useful for multiplying the DC voltage that arises from an ac induced voltage. This is of particular importance to plastic electronics compared to silicon, since the TFTs tend to operate with higher voltages and lower currents than silicon.

Figure 1:
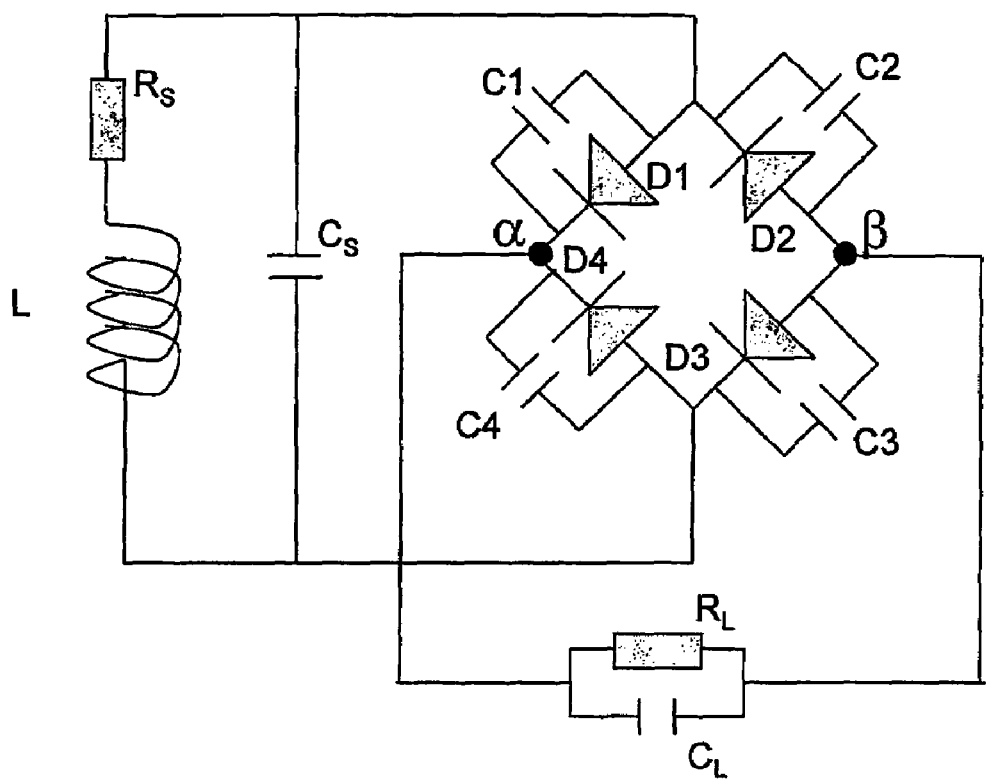
FIG. 1 shows a schematic equivalent circuit of a RF antenna comprising a bridge of rectifying diodes to generate a DC voltage supply for a load device coupled to the antenna.
Figure 11:
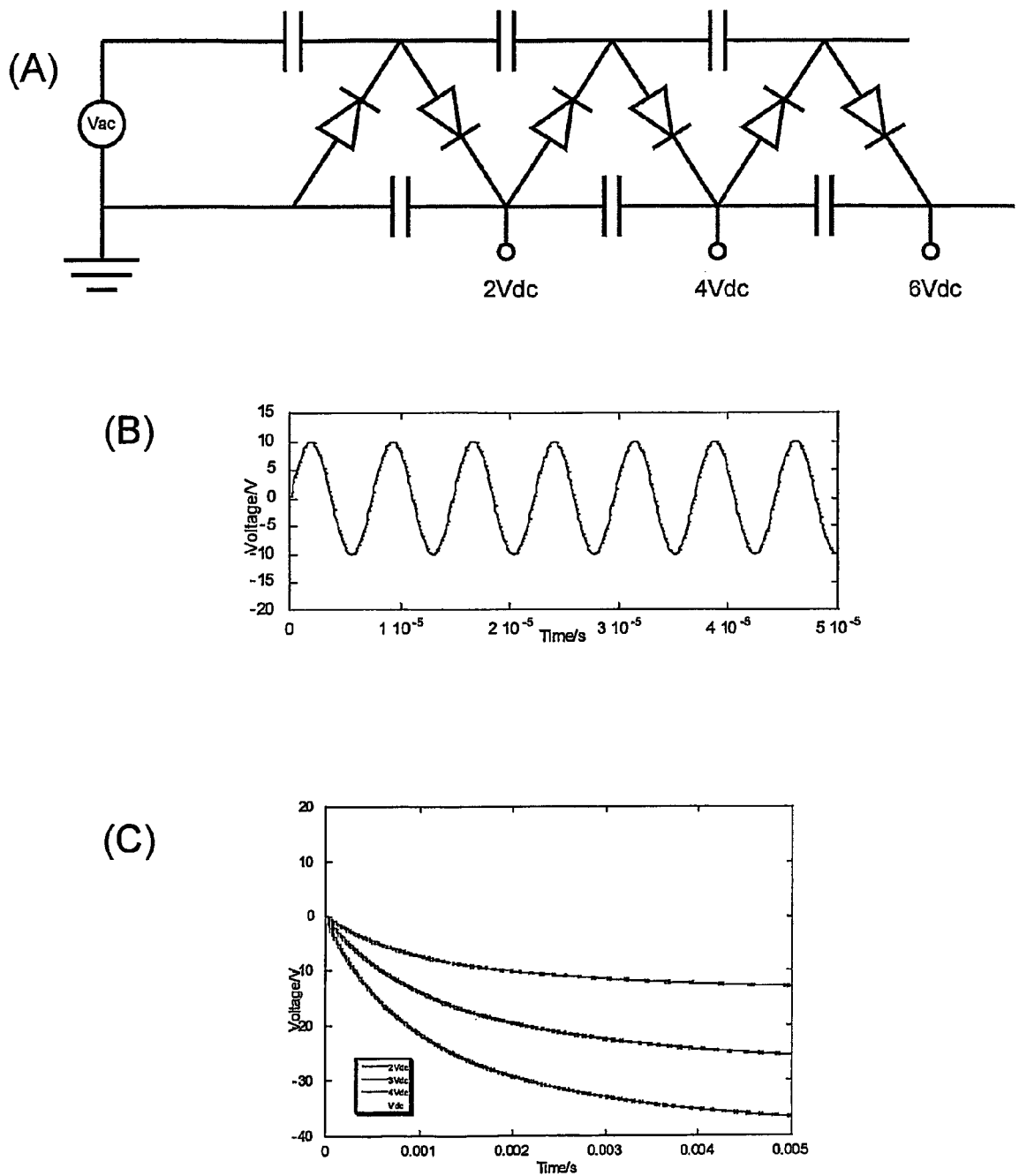
FIG. 11 shows a circuit diagram of a three-stage Viilard cascade charge pump (A) and corresponding circuit simulation (B, C).

The diode devices described above can be used in different rectifier configurations, including but not limited to, the bridge rectifier shown in FIG. 1, or the Villard cascade or charge pump shown in FIG. 11A. The latter both rectifies and multiplies the ac voltage. This is beneficial as organic transistor circuits require relatively large supply voltages of typically 5-40V for their operation. Compared to a conventional bridge rectifier, the DC output voltage of a Villard cascade is up to n times larger, where n is the number of stages in the ladder. Naturally this is at the expense of the available current.

If too much current is drawn at the end of the cascade, some of the voltage is dropped across the capacitors and is therefore lost. The amount lost is given by the Villard formula:

$$\Delta V = \frac{I}{fC}\left[\frac{2}{3}n^3 + \frac{n^2}{2} - \frac{n}{6}\right]$$

For a tag operating at frequency f=125 kHz that requires a dc voltage ~40V to operate, and using typical diode properties as measured experimentally, capacitors of C=8 nF are required. For a three stage Villard cascade (n=3), and a current requirement of 100 µA, the voltage lost is $\Delta V$=2V, so that for an initial 10V RF signal (FIG. 11B), an output of 40-2=38V and a 100 µA current can be obtained. This means that the tag needs to extract more than 4 mW from the RF field. A simulation of the voltage build up at the output of the different stages of a 3-stage Villard cascade as a function of time is shown in FIG. 11C.

The processes and devices described herein are not limited to devices fabricated with solution-processed polymers. For example, some of the conducting electrodes and/or the interconnects may be formed from inorganic conductors, that can, for example, be deposited by printing of a colloidal suspension or by electroplating onto a pre-patterned substrate. In devices in which not all layers are to be deposited from solution one or more layers of the device may be replaced with a vacuum deposited material, such as for example vacuum deposited pentacene. One of more layers of the device might also be patterned by conventional photolithographic techniques.

For the semiconducting layer any solution processible conjugated polymeric or oligomeric material that exhibits adequate field-effect mobilities exceeding $10^{-3}$ cm$^2$/Vs, preferably exceeding $10^{-2}$ cm$^2$/Vs, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)).

The electrodes may be coarse-patterned by techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques. Ink-jet printing is considered to be particularly suitable for large area patterning with good registration, in particular for flexible plastic substrates.

Although preferably all layers and components of the device and circuit are deposited and patterned by solution processing and printing techniques, one or more components may also be deposited by vacuum deposition techniques and/or patterned by a photolithographic process.

Devices such as rectifying diodes fabricated as described above may be part of a more complex circuit or device in which one or more such devices can be integrated with each other and or with other devices. Examples of applications include logic circuits and active matrix circuitry for a display or a memory device, or a user-defined gate array circuit.

The patterning process may be used to pattern other components of such circuit as well, such as interconnects, resistors, capacitors etc.

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method for fabricating a rectifying diode of a device including an active semiconducting layer between two electrodes, wherein the electrodes are formed by a method, comprising:
    forming a first electrode of a first conductive material in a first region of a substrate, depositing a liquid comprising a second conductive material to come in contact with the first electrode and to form a second electrode of the second conductive material in a second region of the substrate spaced from the first region,
    preparing the surface of the first electrode prior to the deposition of the liquid comprising the second material to repel the liquid,
    wherein the shortest distance between the first electrode and the second electrode defines the thickness of the active semiconducting layer of the rectifying diode.

2. A method as claimed in claim 1, wherein the method comprises the additional step of depositing at least one semiconducting layer in the region between the first and second electrodes.

3. A method as claimed in claim 1, wherein the first electrode is also deposited from a liquid.

4. A method as claimed in claim 1, wherein the composition of the liquid from which the first electrode is deposited has a tendency to segregate to form a surface region over the first conductive material, the surface region having a different composition from the first conductive material.

5. A method as claimed in claim 4, wherein said surface region is semiconducting, and forms at least part of the active semiconductor layer of the rectifying diode.

6. A method as claimed in claim 1, wherein the first and second materials are essentially the same.

7. A method as claimed in claim 1, wherein the liquid from which the first electrode is deposited is a solution of at least two components having a tendency to segregate.

8. A method as claimed in claim 7, wherein one of the components is a polymer with a tendency to segregate to the surface of the first composition.

9. A method as claimed in claim 7, wherein one of the components is a diblock copolymer comprising a relatively polar and a relatively non-polar block.

10. A method as claimed in claim 7, wherein one of the components is a surfactant.

11. A method as claimed in claim 1, comprising treating the first electrode prior to deposition of the liquid of the second composition so as to modify at least one physical or chemical property of the surface of the first electrode, thereby forming a surface region over the first conductive material.

12. A method as claimed in claim 11, wherein the step of modifying the surface of the first electrode comprises exposing the substrate to a plasma.

13. A method as claimed in claim 12, wherein said plasma contains fluorinated species.

14. A method as claimed in claim 1, wherein the surface of the first and second electrodes exhibit different workfunctions.

15. A method as claimed in claim 14, wherein the difference in work function between the first and second electrodes is generated by the step of preparing the surface of the first electrode prior to the deposition of the liquid comprising the second material.

16. A method as claimed in claim 14, wherein the surface of the first and/or second electrodes are treated after being deposited to modify the workfunction of at least one of the first and second electrodes.

17. A method as claimed in claim 16, where in the conductive material of the first electrode has a different workfunction than the conductive material of the second electrode.

18. A method as claimed in claim 1, wherein the material of at least one of the first or second electrodes is a printable metal.

* * * * *